United States Patent [19]

Sarkison

[11] 4,363,370

[45] Dec. 14, 1982

[54] ACCURATE WEIGHT MEASUREMENT USING DIGITAL TO ANALOG CONVERTER MEANS AND ANALOG TO DIGITAL CONVERTER MEANS

[75] Inventor: Warren Sarkison, Huntington Beach, Calif.

[73] Assignee: Load Cells Inc., South El Monte, Calif.

[21] Appl. No.: 247,525

[22] Filed: Apr. 7, 1981

[51] Int. Cl.³ ............................................. G01G 3/14
[52] U.S. Cl. .......................... 177/210 R; 177/DIG. 3
[58] Field of Search ............... 177/185, 210 R, 210 C, 177/210 EM, 210 FP, 211, DIG. 3

[56] References Cited

U.S. PATENT DOCUMENTS

| | | | |
|---|---|---|---|
| 3,063,635 | 11/1962 | Gordon | 264/567 |
| 3,464,508 | 9/1969 | Engle et al. | 177/164 |
| 3,708,027 | 1/1973 | Hill | 177/210 R |
| 3,890,833 | 6/1976 | Peer | 73/862.61 |
| 4,024,053 | 5/1977 | Drew, Jr. et al. | 209/593 |
| 4,155,411 | 5/1979 | Weaver | 177/DIG. 3 |

FOREIGN PATENT DOCUMENTS

| | | | |
|---|---|---|---|
| 52-96383 | 2/1977 | Japan | 177/DIG. 3 |
| 52-127965 | 4/1977 | Japan | 177/DIG. 3 |

Primary Examiner—George H. Miller, Jr.
Attorney, Agent, or Firm—William W. Haefliger

[57] ABSTRACT

Electronic scale apparatus includes a face transducer having a first analog output; digital to analog converter circuitry having a second output; a first differential amplifier to receive such outputs and to produce a third output; and a second differential amplifier to receive the third output and output of the converter circuitry to produce another output. A major portion of the weight of the object being weighed is determined at the output of the first differential amplifier (i.e. a coarse measurement). The remaining portion or difference is then amplified and balanced out at the second differential amplifier, enabling accurate determination of weight and driving of the digital to analog converter in feed-back mode.

9 Claims, 1 Drawing Figure

ACCURATE WEIGHT MEASUREMENT USING DIGITAL TO ANALOG CONVERTER MEANS AND ANALOG TO DIGITAL CONVERTER MEANS

BACKGROUND OF THE INVENTION

This invention relates generally to the operation of electronic scales. More particularly it concerns the simplification of scale circuitry, and reduction of error in readout of such scales.

Electronic scales in the past have employed force transducers to provide voltages or signals proportional to weight of the item or items placed on the scale. Such voltages or signals were then amplified and displayed by measurement of such voltages or signals. In so doing, errors were commonly introduced, as for example were due to the operation of measurement devices and temperature changes.

SUMMARY OF THE INVENTION

It is a major object of the invention to provide circuitry overcoming the disadvantages of prior electronic scales circuits, and also to provide a very high degree of accuracy in the output of an electronic scale or scales. Basically, the invention is embodied in a combination that comprises;

(a) a force transducer having a first analog output, (b) digital to analog converter means having a second output, (c) a first differential amplifier operatively connected with the transducer and converter to receive, as input, signals corresponding to said first and second outputs, and to produce a third output corresponding to the amplified difference between said first and second outputs, (d) and a second differential amplifier operatively connected with the output of said first differential amplifier and with said output of the converter means to receive, as inputs, signals corresponding to said third output and to a fourth output of the converter, and to produce a fifth output corresponding to the difference between said third and fourth outputs.

As a result, a major portion of the weight of the object being weighed is determined at the output of the first differential amplifier (i.e. a coarse measurement). The remaining portion or difference is then amplified and balanced out at the second differential amplifier, enabling accurate determination of weight and driving of the digital to analog converter in feed-back mode. Filter amplifier means is typically provided in series between the two differential amplifiers, as will appear, and voltage at a filter amplifier output point is typically employed for read-out drive purposes.

These and other objects and advantages of the invention, as well as the details of an illustrative embodiment, will be more fully understood from the following specification and drawings, in which:

DRAWING DESCRIPTION

FIG. 1 is a circuit diagram.

DETAILED DESCRIPTION

Figure 1:
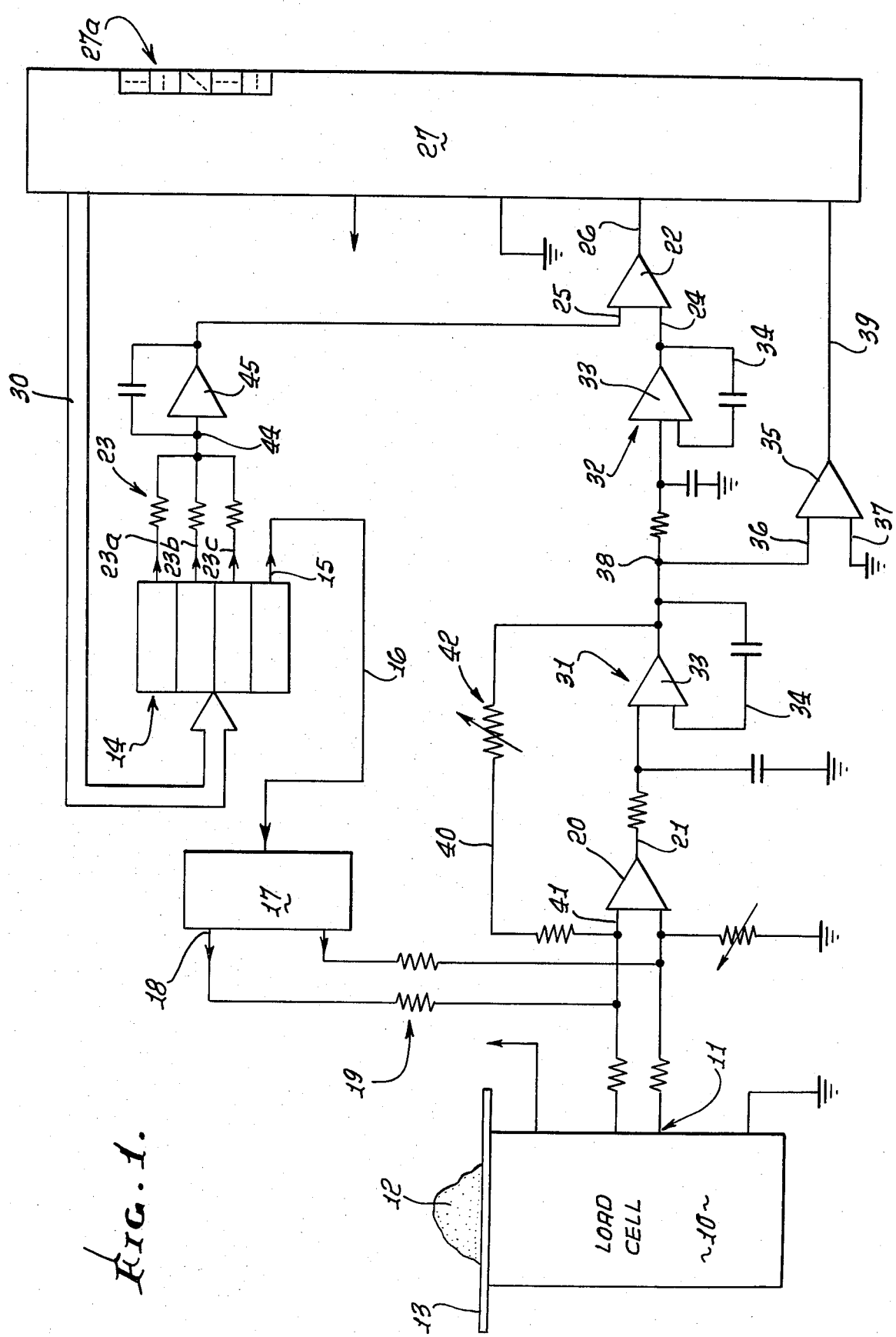

In FIG. 1, block 10 represents a load cell or force transducer whose analog output at 11 is directly proportional to the weight or mass of a body 12 on scale platform 13 over the load cell. A digital to analog (DAC) converter 14 has a second analog output at 15 transmitted at 16 to driver 17. Driver output signals at 18, and which correspond to the DAC output at 15, are transmitted at 19 to a first differential amplifier 20, the latter also receiving as input the output 11 from the load cell. The amplifier (or comparator) 20 produces a third analog output at 21 corresponding to the amplified difference between the outputs at 11 and 15.

A second differential amplifier (or comparator) 22 is operatively connected with the output side of the first differential amplifier 20, and also with the output of the DAC 14, to receive, as inputs at 24 and 25, signals corresponding to the third output 21, and to a fourth output (as at 23) of the DAC, in order to produce a fifth output, at 26, corresponding to the difference between the third and fourth outputs at 21 and 23, as described. The output at 26 is transmitted to control circuitry indicated generally at 27. The latter includes a microprocessor driven by output 26, and typically incorporating an analog to digital converter with digital readout at 27a indicating the weight of the item 12 on the scale. The digital output of the microprocessor is also conveyed at 30 to the DAC 14 to drive it in a direction and to a level such that the DAC outputs at 15 and 23, when fed to the differential amplifiers 20 and 22, quickly produce a nominal or zero output at 26. In this regard, the level of output 15 is typically substantially in excess (as for example 64 times) the level of output at 23, and is effectively digitally summed with the output at 23 to arrive at the proper weight.

Additional circuitry includes filter means (as for example the first and second filter amplifiers 31 and 32 connected in series as shown between the first and second differential amplifiers. Those filter amplifiers remove any ripple or transients in the essentially DC output of the amplifier 20 and amplify the error or differential output at 21. Each filter includes an amplifier 33, with feed-back at 34. Thus the error at 21, through re-amplification at 22, is accurately balanced out.

Another comparator 35 has its output terminals 36 and 37 respectively connected with point 38 and with ground, and its output 39 with the circuitry 27 to provide rapid driving of the readout 27a in accordance with voltage at 38 between the two filters. A feed-back loop 40 is connected between point 38 and the input point 41 to the first differential amplifier 20, to set (via adjustable resistor 42) the gain of the amplifier 20, and to zero the readout.

The DAC 14 is shown as having its output 23 made up of three outputs 23a, 23b and 23c, connected in parallel and summed at 44 at the input of summing and filter amplifier 45.

Commercially available components are listed as follows:

|  | Model & Manufacturer | |
| --- | --- | --- |
| load cell 10 | MK VI | Load Cells Inc. |
| DAC 14 | UA 9706 | Fairchild |
| driver 17 | 40-13 | Fairchild |
| diff. amp. 20 | PO-07 | Fairchild |
| diff. amp. 22 | LM 311 | National Semiconductor |
| microprocessor 27 | 8080 | Intel |

I claim:

1. In an electronic scale apparatus, the combination comprising (a) a force transducer having a first analog output that is ultimately converted to a digital output, (b) the digital output being fed to a digital to analog converter means having a second output, (c) a first differential amplifier operatively connected with said tranducer and converter to receive, as inputs, signals corresponding to said first and second outputs, and to produce a third output corresponding to the amplified difference between said first and second outputs, (d) and a second differential amplifier operatively connected with the output of said first differential amplifier and with said output of the converter means to receive, as inputs, signals corresponding to said third output and to a fourth output of the converter, and to a produce a fifth output corresponding to the difference between said third and fourth outputs, said fifth output driven in a direction to balance the third and fourth outputs.

2. The combination of claim 1 including a differential driver connected between the converter means and said first differential amplifier.

3. The combination of claim 1 including a microprocessor operatively connected between said second differential amplifier and said converter means to drive the converter so as to minimize said fifth output.

4. The combination of claim 1 including a control means connected with the converter means to establish the level of said second output.

5. The combination of claim 4 wherein said converter means includes circuitry to establish said converter means second output at a multiplied level of said converter means fourth output.

6. The combination of claim 1 wherein filter means is connected in series between the first and second differential amplifiers.

7. The combination of claim 6 wherein said filter means includes first and second filters, connected in series, and including an output terminal connected with the output of the first filter.

8. The combination of claim 7 including a microprocessor operatively connected between said second differential amplifier and said converter means to drive the converter so as to minimize said fifth output.

9. The combination of claim 8 including means connected between the output side of the first filter and said microprocessor to drive the latter.

* * * * *